United States Patent
Jin

(10) Patent No.: US 7,697,351 B2
(45) Date of Patent: Apr. 13, 2010

(54) CIRCUIT AND METHOD FOR CONTROLLING INTERNAL VOLTAGE OF SEMICONDUCTOR MEMORY APPARATUS

(75) Inventor: Seung-Eon Jin, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 219 days.

(21) Appl. No.: 11/593,032

(22) Filed: Nov. 6, 2006

(65) Prior Publication Data
US 2007/0145421 A1    Jun. 28, 2007

(30) Foreign Application Priority Data
Dec. 26, 2005    (KR) ........................ 10-2005-0129742

(51) Int. Cl.
*G11C 7/00* (2006.01)
(52) U.S. Cl. .................... 365/189.11; 365/226; 365/227
(58) Field of Classification Search ............ 365/189.11, 365/226–229
See application file for complete search history.

(56) References Cited

U.S. PATENT DOCUMENTS

| | | | |
|---|---|---|---|
| 6,567,067 B2 * | 5/2003 | Azami ........................ 345/100 |
| 6,605,963 B2 * | 8/2003 | Kitamoto et al. ............... 326/81 |
| 6,720,802 B2 * | 4/2004 | Cho ............................ 327/108 |
| 6,850,453 B2 * | 2/2005 | Park ............................ 365/227 |
| 7,123,522 B2 * | 10/2006 | Ho et al. ................. 365/189.11 |
| 7,245,153 B2 * | 7/2007 | Murakami ..................... 326/80 |
| 7,260,014 B1 * | 8/2007 | Akaogi et al. ................ 365/226 |
| 7,292,494 B2 * | 11/2007 | Hsu et al. ..................... 365/226 |
| 2005/0122820 A1 * | 6/2005 | Choi et al. ................... 365/226 |
| 2005/0141319 A1 * | 6/2005 | Jang ............................ 365/226 |
| 2005/0201178 A1 | 9/2005 | Ho et al. |
| 2007/0018710 A1 * | 1/2007 | Choi et al. ................... 327/333 |
| 2008/0018381 A1 * | 1/2008 | Shin ............................ 327/536 |

FOREIGN PATENT DOCUMENTS

| | | |
|---|---|---|
| JP | 2003224463 | 8/2003 |
| JP | 1020040002270 | 1/2004 |
| KR | 1020040065776 A | 7/2004 |

* cited by examiner

*Primary Examiner*—Huan Hoang
(74) *Attorney, Agent, or Firm*—Venable LLP; Jeffri A. Kaminski

(57) ABSTRACT

A circuit for controlling an internal voltage of a semiconductor memory apparatus including a deep power down signal input unit, which receives a deep power down signal indicating that a deep power down mode is starting, and supplies the received signal to a level shifter; and one or more level shifters, each of which performs level shifting from a first voltage to a second voltage or sinks the second voltage to a ground voltage in response to the input of the deep power down signal.

8 Claims, 2 Drawing Sheets

CIRCUIT AND METHOD FOR CONTROLLING INTERNAL VOLTAGE OF SEMICONDUCTOR MEMORY APPARATUS

BACKGROUND

1. Technical Field

The present invention relates to a circuit and method for controlling an internal voltage of a semiconductor memory apparatus, and more particularly, to a circuit and method for controlling an internal voltage of a semiconductor memory apparatus which are capable of reducing a leakage current by sinking the internal voltage of a level shifter to a ground voltage when the semiconductor memory apparatus is in a deep power down mode.

2. Related Art

In general, semiconductor memory apparatuses, such as DRAMs (dynamic random access memories), operate in an active state and in a stand-by state. When the semiconductor memory apparatus is in the active state, circuits inside a chip output data or receive data. On the other hand, when the semiconductor memory apparatus is in the stand-by state, in order to reduce the power consumption of the chip to a minimum, a current is supplied to only the circuits that allow the semiconductor memory apparatus to be transferred to the active state. However, when the semiconductor memory apparatus is kept in the stand-by state for a long time, a current continuously flows through the circuit keeping it enabled, in order to allow the semiconductor memory apparatus to enter the active state, resulting in unnecessary power consumption.

Therefore, in the related art, a method has been used of transferring a semiconductor memory apparatus to a deep power down mode in which, in order to reduce the amount of current flowing in the stand-by state, almost all the current paths of a chip are blocked to reduce a stand-by current to a minimum. In addition, in the deep power down mode, in order to prevent the semiconductor memory apparatus from being unnecessarily operated due to the current remaining in the internal circuits of a chip, all the voltages of the internal circuits, such as an elevated voltage, a core voltage, a bit-line pre-charge voltage, and a substrate bias voltage, are sunk to a ground voltage. As described above, in the deep power down mode, except for a command for instructing the start and end of the deep power down mode, the levels of all data stored in, for example, a memory cell and a register are sunk to the ground voltage.

A level shifter is used between power supplies having different voltage levels in the semiconductor memory apparatus. In particular, since the elevated voltage is the highest voltage of the voltages used in the semiconductor memory apparatus, a level shifter is typically used in a circuit having an external voltage source and an elevated voltage source connected to each other. Therefore, a description will be made below of an example in which the elevated voltage is used as an internal voltage of the semiconductor memory apparatus.

FIG. 1 is a diagram illustrating a level shifter according to the related art.

More specifically, FIG. 1 shows a level shifter 10 for converting the external voltage VDD into the elevated voltage VPP in response to the input of a control signal ctrl.

The level shifter 10 is composed of a differential amplifier which uses the elevated voltage VPP and a ground voltage VSS as a power supply voltage and includes four transistors TR1 to TR4 operated in response to the input of the external voltage VDD. In addition, a first inverter IV1 having the elevated voltage VPP applied thereto is provided at an output end of the level shifter 10.

The level shifter 10 operates in response to the input of the control signal ctrl. When the control signal ctrl changes to an enable state and is transmitted to the level shifter 10 as a high-level signal, the fourth transistor TR4 of the level shifter 10 is turned on. At that time, the third transistor TR3 has already been turned on by the external voltage VDD. Since a high-level voltage is applied to a node N1 by the control signal ctrl, a high-level voltage is also applied to the node N2. Therefore, the second transistor TR2 is turned off and the fourth transistor TR4 is turned on, which causes the voltage level of a node N3 to be lowered to the ground voltage VSS. Thereafter, the low-level voltage of the node N3 causes the first transistor TR1 to be turned on, so that the elevated voltage VPP is applied to the node N2.

The low-level voltage applied to the node N3 is inverted into a high-level voltage by the first inverter IV1, and the inverted voltage is output as a signal having the level of the elevated voltage VPP.

At that time, since the voltage level of the node N2 is high, the second transistor TR2 is turned off. Therefore, even when the semiconductor memory level is transferred to the deep power down mode and the generation of the elevated voltage VPP stops, the elevated voltage VPP of the level shifter 10 is not sunk to the ground voltage VSS.

The level shifter 10 does not include a circuit for sinking the elevated voltage VPP to the ground voltage VSS. Level shifters used for various other parts of the semiconductor memory apparatus as well as the level shifter 10 hold a predetermined level of voltage for a long time in the deep power down mode. In the deep power down mode, a leakage current is generated by the circuits whose levels are not immediately sunk to the ground voltage VSS in the deep power down mode.

SUMMARY

Accordingly, embodiments of the present invention provide a circuit and method for controlling an internal voltage of a semiconductor memory apparatus which are capable of reducing a leakage current. This may be done by supplying a ground voltage to a level shifter in a deep power down mode to sink the internal voltage of the level shifter to a ground voltage.

According to an embodiment of the present invention, a circuit is provided for controlling an internal voltage of a semiconductor memory apparatus. The circuit includes: a deep power down signal input unit which receives a deep power down signal indicating that a deep power down mode is starting and supplies the received signal to a level shifter; and one or more level shifters, each of which performs level shifting from a first voltage to a second voltage or sinks the second voltage to a ground voltage in response to the input of the deep power down signal.

According to another embodiment of the present invention, a method of controlling an internal voltage of a semiconductor memory apparatus is provided. The method includes: performing level shifting from a first voltage to a second voltage when the semiconductor memory apparatus is not in a deep power down mode; and when a ground voltage is input, sinking the second voltage to the ground voltage in the deep power down mode.

DESCRIPTION OF EXEMPLARY EMBODIMENT

Hereinafter, preferred embodiments of the present invention will be described below in detail with reference to the accompanying drawings. According to an embodiment, for example, a level shifter is provided between an external voltage source and an elevated voltage source in an internal voltage control circuit of a semiconductor memory apparatus of the present invention.

Figure 1:
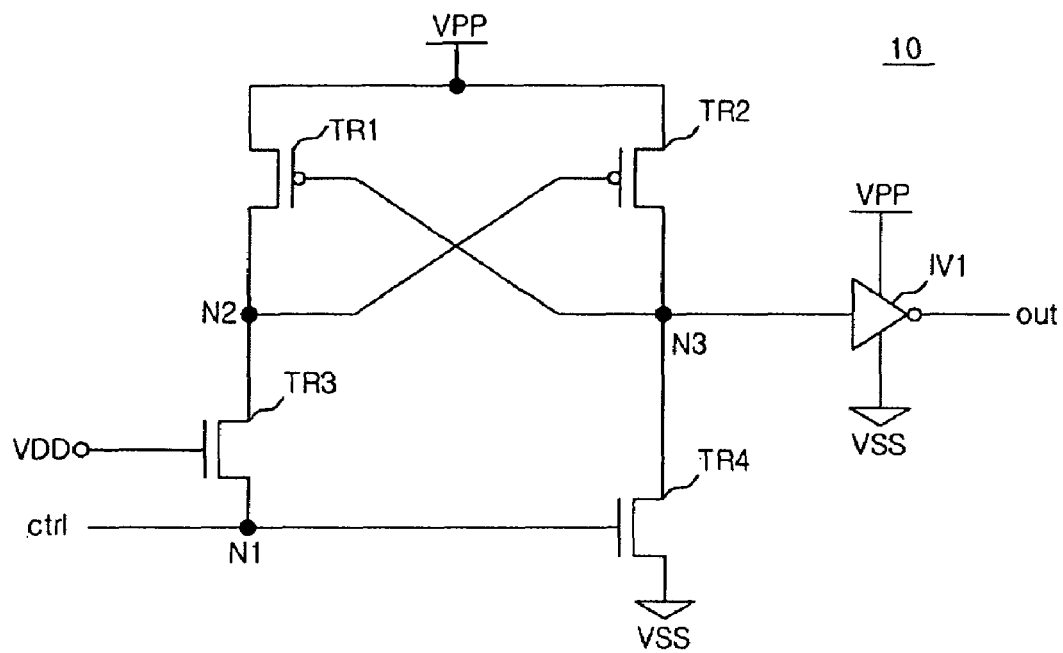
FIG. 1 is a diagram illustrating the structure of a level shifter according to the related art.
Figure 2:
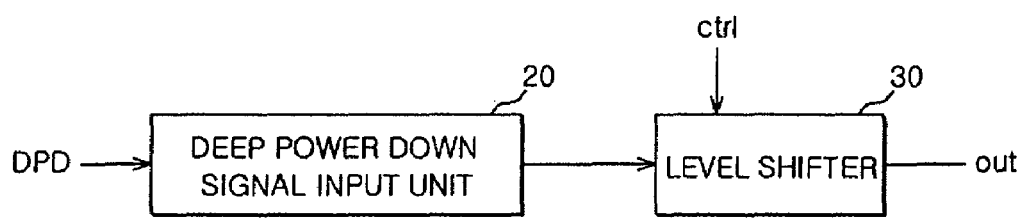
FIG. 2 is a block diagram illustrating an elevated voltage control circuit of a semiconductor memory apparatus according to an embodiment of the present invention.

FIG. 2 is a block diagram illustrating a high-voltage control circuit of a semiconductor memory apparatus according to an embodiment of the present invention.

As shown in FIG. 2, the high-voltage control circuit includes a deep power down signal input unit 20 which receives a deep power down signal DPD indicating that a deep power down mode is starting and supplies the received signal to a level shifter 30, and the level shifter 30 that shifts the level of the external voltage VDD to the elevated voltage VPP or sinks the elevated voltage VPP to a ground voltage VSS.

When the semiconductor memory apparatus changes to the deep power down mode, the deep power down signal DPD is enabled. The deep power down signal input unit 20 receives the deep power down signal DPD. When the deep power down signal DPD is enabled, the deep power down signal input unit 20 supplies the ground voltage VSS to the level shifter 30. On the other hand, when the deep power down signal DPD is disabled, the deep power down signal input unit 20 supplies the external voltage VDD to the level shifter 30. When the deep power down signal DPD is disabled, causing the external voltage VDD to be supplied to the level shifter 30, the level shifter 30 performs a level shifting operation, raising the level of the external voltage VDD to the level of the elevated voltage VPP. On the other hand, when the deep power down signal DPD is enabled, causing the ground voltage VSS to be supplied to the level shifter 30, the level shifter 30 sinks the elevated voltage VPP to the level of the ground voltage VSS.

Figure 3:
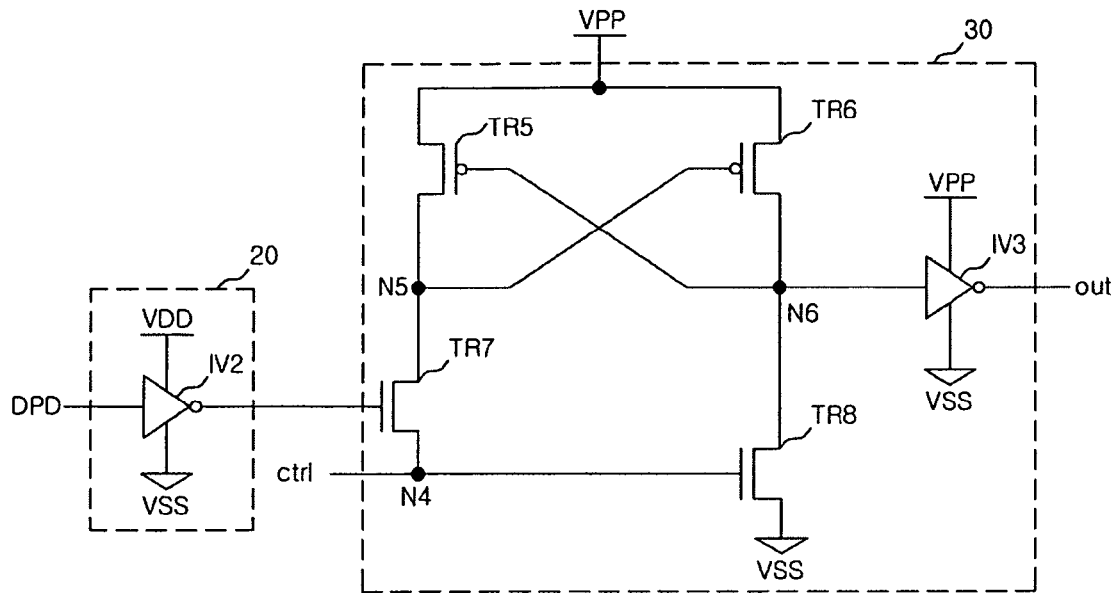
FIG. 3 is a diagram illustrating the detailed structure of the elevated voltage control circuit of the semiconductor memory apparatus shown in FIG. 2.

FIG. 3 is a diagram illustrating the detailed structure of the high-voltage control circuit of the semiconductor memory apparatus shown in FIG. 2.

The deep power down signal input unit 20 is provided with a second inverter IV2 which uses the external voltage VDD and the ground voltage VSS as a power supply voltage and receives the deep power down signal DPD.

The level shifter 30 is composed of a differential amplifier which uses the elevated voltage VPP and the ground voltage VSS as a power supply voltage and includes four transistors TR5 to TR8 operated according to the input of the external voltage VDD. In addition, a third inverter IV3 to which the elevated voltage VPP is applied is provided at an output end of the level shifter 30.

When the deep power down signal DPD is disabled, the external voltage VDD is supplied from the deep power down signal input unit 20 to the level shifter 30. At that time, when a control signal ctrl is enabled, causing a high-level signal to be transmitted to the level shifter 30, the eighth transistor TR8 of the level shifter 30 is turned on. The seventh transistor TR7 is turned on when the external voltage VDD is inputted. A high-level voltage is applied to a node N4 by the control signal ctrl, which causes a high-level voltage to be applied to a node N5. As a result, the sixth transistor TR6 is turned off and the eighth transistor TR8 is turned on, which causes the voltage level of a node N6 to change to the ground voltage VSS. Then, the low-level voltage of the node N6 causes the fifth transistor TR5 to be turned on, and thus the elevated voltage VPP is applied to the node N5.

The low-level voltage applied to the node N6 is inverted into a high-level voltage by the third inverter IV3, and the inverted voltage is outputted as a signal having the high-level voltage VPP.

On the other hand, when the deep power down signal DPD is enabled, the ground voltage VSS is supplied from the deep power down signal input unit 20 to the level shifter 30. At that time, when the control signal ctrl is enabled, causing a high-level signal to be transmitted to the level shifter 30, the eighth transistor TR8 of the level shifter 30 is turned on. The seventh transistor TR7 is turned off when the ground voltage VSS is input. A high-level voltage is applied to the node N4 by the control signal ctrl. However, when the seventh transistor TR7 is turned off, the high-level voltage of the node N4 is not applied to the node N5. Therefore, the sixth transistor TR6 is turned on, and a current flows through the sixth transistor TR6. The current flowing through the sixth transistor TR6 causes the fifth transistor TR5 to be turned off. Thus, the voltage of the node N5 is kept at a low level, and the elevated voltage VPP is applied to the node N6. Since the eighth transistor TR8 is turned off, a terminal of the elevated voltage VPP is directly connected to a terminal of the ground voltage VSS. Since the semiconductor memory apparatus has already been in the deep power down mode, the elevated voltage VPP applied to the level shifter 30 is not generated again. At that time, when the terminal of the elevated voltage VPP is directly connected to the terminal of the ground voltage VSS, the terminal of the elevated voltage VPP is sunk to the ground voltage VSS, which makes it possible to reduce a leakage current from the level shifter 30.

Figure 4:
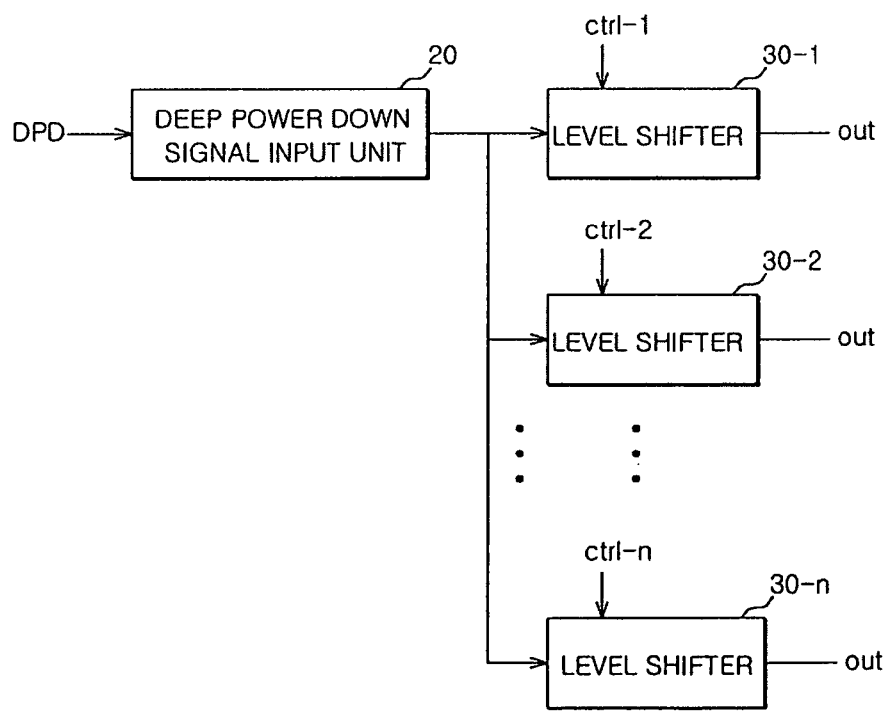
FIG. 4 a block diagram illustrating an elevated voltage control circuit of a semiconductor memory apparatus according to another embodiment of the present invention.

FIG. 4 is a block diagram illustrating a high-voltage control circuit of a semiconductor memory apparatus according to another embodiment of the present invention.

The high-voltage control circuit may include one deep power down signal input unit 20 so as to control the operation of a plurality of level shifters 30-1, 30-2, . . . , 30-n.

As shown in FIG. 4, when the one deep power down signal input unit 20 is connected to the plurality of level shifters 30-1, 30-2, . . . , 30-n, it is possible to sink the internal voltage of the level shifter 30 to the ground voltage VSS in the deep power down mode, without an additional reduction in area margin.

In this way, in the deep power down mode of the semiconductor memory apparatus, when the level shifter is supplied with the ground voltage VSS instead of the external voltage VDD, it is possible to reduce a leakage current caused by the level shifter in the deep power down mode by sinking the internal voltage of the level shifter to the ground voltage VSS.

It will be understood by those skilled in the art that various modifications and changes to the invention can be made without departing from the scope and spirit of the invention. Therefore, it should be understood that the above-described embodiment is not restrictive, but illustrative in all aspects. It will be understood that the scope of the invention is defined by the following claims rather than by the detailed description of the invention, and the invention covers changes and modifications derived from the scope and spirit of the appended claims and their equivalents.

As described above, according to a circuit and method for controlling the internal voltage of a semiconductor memory apparatus, it is possible to sink the internal voltage of a level shifter to the ground voltage and thus reduce a leakage current of the semiconductor memory apparatus by supplying the ground voltage in the deep power down mode of the semiconductor memory apparatus.

What is claimed is:

1. A circuit for controlling an internal voltage of a semiconductor memory apparatus, comprising:
 a deep power down signal input unit adapted to receive a deep power down signal indicating that a deep power down mode is starting; and
 one or more level shifters configured to receive a control signal and coupled to the deep power down signal input unit to receive the deep power down signal, each of the level shifters adapted to perform level shifting from a first voltage to a second voltage or to sink the second voltage to a ground voltage in response to the input of the deep power down signal and the control signal.

2. The circuit for controlling an internal voltage of a semiconductor memory apparatus of claim 1,
 wherein the deep power down signal input unit includes an inverter configured to use the first voltage and the ground voltage as a power supply voltage and to receive the deep power down signal as input.

3. The circuit for controlling an internal voltage of a semiconductor memory apparatus of claim 1,
 wherein the level shifter comprises a differential amplifier, the differential amplifier configured to use the second voltage and the ground voltage as a power supply voltage and to operate in response to input of the first voltage.

4. The circuit for controlling an internal voltage of a semiconductor memory apparatus of claim 1,
 wherein the first voltage is an external voltage.

5. The circuit for controlling an internal voltage of a semiconductor memory apparatus of claim 1,
 wherein the second voltage is an elevated voltage having a higher level than a level of the first voltage.

6. A method of controlling an internal voltage of a semiconductor memory apparatus, comprising:
 performing level shifting from a first voltage to a second voltage in response to a control signal when the semiconductor memory apparatus is not in a deep power down mode; and
 when a ground voltage is inputted, sinking the second voltage to the ground voltage in response to a control signal in the deep power down mode.

7. The method of controlling an internal voltage of a semiconductor memory apparatus of claim 6,
 wherein the first voltage is an external voltage.

8. The method of controlling an internal voltage of a semiconductor memory apparatus of claim 6,
 wherein the second voltage is an elevated voltage having a higher level than a level of the first voltage.

* * * * *